(12) United States Patent
Saito

(10) Patent No.: US 8,441,868 B2
(45) Date of Patent: May 14, 2013

(54) SEMICONDUCTOR MEMORY HAVING A READ CIRCUIT

(75) Inventor: Toshihiko Saito, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 219 days.

(21) Appl. No.: 13/078,019

(22) Filed: Apr. 1, 2011

(65) Prior Publication Data

US 2011/0249502 A1   Oct. 13, 2011

(30) Foreign Application Priority Data

Apr. 9, 2010   (JP) .................................. 2010-090569

(51) Int. Cl.
*G11C 7/00*   (2006.01)

(52) U.S. Cl.
USPC ....................................... 365/189.15; 365/63

(58) Field of Classification Search ............. 365/189.15, 365/63
See application file for complete search history.

(56) References Cited

U.S. PATENT DOCUMENTS

| | | | |
|---|---|---|---|
| 4,758,748 A | 7/1988 | Takeuchi | |
| 5,487,036 A | 1/1996 | Akaogi et al. | |
| 5,490,107 A | 2/1996 | Akaogi et al. | |
| 5,537,356 A | 7/1996 | Akaogi et al. | |
| 5,572,463 A | 11/1996 | Akaogi et al. | |
| 5,590,074 A | 12/1996 | Akaogi et al. | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,646,922 B2 | 11/2003 | Kato | |
| 6,727,522 B1 | 4/2004 | Kawasaki et al. | |
| 6,768,680 B2 | 7/2004 | Kato | |
| 7,049,190 B2 | 5/2006 | Takeda et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

International Search Report (Application No. PCT/JP2011/056511) Dated Jun. 21, 2011.

(Continued)

*Primary Examiner* — Tuan T. Nguyen
(74) *Attorney, Agent, or Firm* — Eric J. Robinson; Robinson Intellectual Property Law Office, P.C.

(57) ABSTRACT

The semiconductor device includes the read circuit which reads data written to a memory cell. The read circuit includes a first transistor, a second transistor, a first switch, and a second switch. A first terminal of the first transistor is electrically connected to a gate of the first transistor, and a second terminal of the first transistor is electrically connected to an output from the read circuit via the first switch. A first terminal of the second transistor is electrically connected to a gate of the second transistor, and a second terminal of the second transistor is electrically connected to the output from the read circuit via the second switch. A channel formation region of the first transistor can be formed using an oxide semiconductor, and a channel formation region of the second transistor can be formed using silicon.

33 Claims, 9 Drawing Sheets

U.S. PATENT DOCUMENTS

| | | |
|---|---|---|
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,719,872 B2 | 5/2010 | Kato |
| 7,732,819 B2 | 6/2010 | Akimoto et al. |
| 7,760,552 B2 | 7/2010 | Miyake et al. |
| 8,058,675 B2 | 11/2011 | Kimura |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0026145 A1* | 2/2003 | Lee ............................ 365/200 |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0109729 A1* | 5/2006 | Yaoi et al. ...................... 365/226 |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0230252 A1* | 10/2007 | Campardo et al. ......... 365/185.23 |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0073775 A1* | 3/2009 | Lee ........................... 365/185.25 |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0214856 A1* | 8/2010 | Shiah ....................... 365/189.16 |
| 2010/0259968 A1 | 10/2010 | Tsushima et al. |
| 2012/0049185 A1 | 3/2012 | Kimura |

FOREIGN PATENT DOCUMENTS

| | | |
|---|---|---|
| JP | 63-215519 A | 0/9198 |
| JP | 60-198861 A | 10/1985 |
| JP | 61-165895 A | 7/1986 |
| JP | 62-222498 A | 9/1987 |
| JP | 63-210022 A | 8/1988 |
| JP | 63-210023 A | 8/1988 |
| JP | 63-210024 A | 8/1988 |
| JP | 63-239117 A | 10/1988 |
| JP | 63-265818 A | 11/1988 |
| JP | 64-088998 A | 4/1989 |
| JP | 01-279499 A | 11/1989 |
| JP | 04-360096 A | 12/1992 |
| JP | 05-251705 A | 9/1993 |
| JP | 08-264794 A | 10/1996 |
| JP | 08-339693 | 12/1996 |
| JP | 10-031897 A | 2/1998 |
| JP | 10-228784 | 8/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-036689 A | 2/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165532 A | 6/2006 |
| JP | 2007-294077 | 11/2007 |
| JP | 2008-182209 A | 8/2008 |
| JP | 2010-062229 A | 3/2010 |
| WO | WO-2004/114391 | 12/2004 |
| WO | 2009/075316 | 6/2009 |

OTHER PUBLICATIONS

Written Opinion (Application No. PCT/JP2011/056511) Dated Jun. 21, 2011.

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature; Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : . SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350° C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3,4, and 5), InGaO3(ZnO)3, and Ga2O3(ZnO)m (m=7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films By Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", , SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08: SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting. Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

OHara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue-Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID Internatinal Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-IN. AMOLED Display With Driver Circuit Using Amorphous In-Ga-Zn-Oxide TFTS,", IDW '09: Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperatuare Dependence of Characteristics and Electronic Structure For Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID Internatinal Symposium Digest of Technical Papers, 2007, vol. 38, pp. 1830-1833.

Godo.H et al., "P-9:Numerical Analysis on Temperataure Dependence of Characteristics of Amorphous In-Ga-Zn-Oxide TFT,", SID Digest '09 : SID International Symposium Digest of Technical Papers, May 31, 2009, pp. 1110-1112.

OHara.H et al., "21.3:4.0 IN. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switchng in Polymer-Stabilized Liquid Crystalline Blue Phases for Display Application,", SID Digest '07 : SID International Symposium Digest of Technical Papers, 2007, vol. 38, pp. 1737-1740.

Nakamara.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue-Phases,", Nature Materials, Sep. 1, 2002, vol. 1, pp. 64-68.

Kimizuka.N et al., "SPINEL, YBFE2O4, and YB2FE3O7 Types of Structures for Compounds in the IN2O3 and SC2O3-A2O3-BO Systems [A; Fe, Ga, Or Al; B: Mg, Mn, Fe, Ni, Cu, Or Zn] at Temperatures over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review.B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A Hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol.B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society). 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

| R121>R101 | Vout=0 |
| --- | --- |
| R121<R101 | Vout=1 |

| R122>R101 | Vout=0 |
| --- | --- |
| R122<R101 | Vout=1 |

FIG. 9A

| Writing (Erasing) | | | |
|---|---|---|---|
| Verify <Judging whether data is normally written to (or erased from) the memory cell> | Normal | Normal | Error |
| Reading | Normal | Normal | |

FIG. 9B

| Writing (Erasing) | | | |
|---|---|---|---|
| Verify <Judging whether data is normally written to (or erased from) the memory cell> | Normal | Normal | Error |
| Reading | Normal | Error | |

↑ Malfunction

SEMICONDUCTOR MEMORY HAVING A READ CIRCUIT

TECHNICAL FIELD

The present invention relates to a read circuit which reads data written to a memory cell. In addition, the present invention relates to a semiconductor device including the above-described read circuit.

BACKGROUND ART

After writing (or erasing) of data to (from) a memory cell is finished, the verification is performed to judge (also referred to as to verify or check) whether the data is normally written to (or erased from) the memory cell (e.g., Patent Document 1).

[Reference]

[Patent Document 1] Japanese Published Patent Application No. 2007-294077

DISCLOSURE OF INVENTION

As illustrated in FIG. 9A, in the case where it is judged that data is normally written (or erased) in verification, the written (or erased) data can be read normally. However, as illustrated in FIG. 9B, even in the case where it is judged that data is normally written (or erased) in verification, the written (or erased) data is not read normally and an error occurs in some cases.

Thus, it is an object to provide a read circuit which does not cause a malfunction, for example, a failure in normal reading of written (or erased) data, which is an error in reading the data, is caused in the case where it is judged that the data is normally written (or erased) in verification. In addition, it is an object to provide a read circuit which can effectively use a judgment result of verification. Further, it is an object to provide a read circuit which can read data with high accuracy. Furthermore, it is an object to provide a semiconductor device which is highly reliable because the above-described read circuit is included.

One embodiment of the present invention relates to a semiconductor device including a read circuit configured to read data written to a memory cell. The read circuit includes a first transistor, a second transistor, a first switch, and a second switch. A first terminal of the first transistor is electrically connected to a gate of the first transistor and a second terminal of the first transistor is electrically connected to an output from the read circuit via the first switch. A first terminal of the second transistor is electrically connected to a gate of the second transistor and a second terminal of the second transistor is electrically connected to the output from the read circuit via the second switch.

In the above structure, the first terminal of the first transistor and the first terminal of the second transistor are electrically connected to a wiring to which a power supply potential Vdd is supplied.

In the above structure, threshold voltage of the first transistor is different from threshold voltage of the second transistor.

In the above structure, the threshold voltage of the first transistor is higher than the threshold voltage of the second transistor.

In the above structure, a transistor with a channel formation region including an oxide semiconductor can be used as the first transistor, and a transistor with a channel formation region including silicon can be used as the second transistor.

The channel formation regions of the first transistor and the second transistor are formed using different semiconductor materials in this manner, whereby the threshold voltage of the first transistor can easily be made to differ from that of the second transistor in comparison with the case where the channel formation regions of the first transistor and the second transistor are formed using the same semiconductor material.

In the above structure, data can be read using the first transistor in verification where whether data is normally written to (or erased from) the memory cell is judged, and data can be read using the second transistor in general reading. In this manner, reading of data in verification can be performed using the first transistor with relatively high threshold voltage, and reading of data in general reading can be performed using the second transistor with relatively low threshold voltage. Note that hereinafter, reading of data for judgment is referred to as verification, and general reading of data is simply referred to as reading.

In the above structure, in verification, the first switch is turned on, whereby the first transistor and the output from the read circuit are brought into conduction, and the second switch is off. In reading, the second switch is turned on, whereby the second transistor and the output from the read circuit are brought into conduction, and the first switch is off.

In the above structure, a power supply potential Vdd2 has the same value as or a value smaller than the value of a power supply potential Vdd1, that is, the power supply potential Vdd2 is lower than or equal to the power supply potential Vdd1. Here, the power supply potential Vdd2 is the potential supplied from the outside to the wiring which is electrically connected to the first terminal of the first transistor and the wiring which is electrically connected to the first terminal of the second transistor in reading. And also, the power supply potential Vdd1 is the potential supplied from the outside to the wiring which is electrically connected to the first terminal of the first transistor and the wiring which is electrically connected to the first terminal of the second transistor in verification.

In the above structure, the power supply potential Vdd (including Vdd1 and Vdd2) can be wirelessly supplied from the outside. In the case where the power supply potential Vdd is wirelessly supplied from the outside, the power supply potential Vdd fluctuates in some cases. For example, when a distance between the above-described semiconductor device which is one embodiment of the disclosed invention and an external device on the power supply side is short, the power supply potential Vdd supplied from the outside increases. In contrast, when the distance between the above-described semiconductor device and the external device on the power supply side is long, the power supply potential Vdd supplied from the outside decreases.

For example, a distance D2 in reading between the above-described semiconductor device and the external device on the power supply side is the same as or longer than a distance D1 in verification between the above-described semiconductor device and the external device on the power supply side. That is, the distance D2 is longer than or equal to the distance D1. Therefore, the power supply potential Vdd2 is lower than or equal to the power supply potential Vdd1. The power supply potential Vdd2 is the potential supplied from the outside to the wiring which is electrically connected to the first terminal of the first transistor and the first terminal of the second transistor in reading. The power supply potential Vdd1 is the potential supplied from the outside to the wiring which is electrically connected to the first terminal of the first transistor and the first terminal of the second transistor in verification. According to the one embodiment of the present invention, even in the case where the power supply potential Vdd in verification differs from that in reading as described above, a judgment result of verification can be effectively used.

In the above structure, the read circuit can include an inverter electrically connected to the output from the read circuit or a sense amplifier electrically connected to the output from the read circuit. Accordingly, reading accuracy can be improved.

In the above structure, the first transistor can have a back gate.

In the above structure, the semiconductor device can include a memory cell. In that case, the memory cell can be electrically connected to the output from the read circuit via a third switch.

In the above structure, in the verification, the first switch and the third switch are turned on, whereby the first transistor and the memory cell, and the output from the read circuit are brought into conduction, and the second switch is off. In the reading, the second switch and the third switch are turned on, whereby the second transistor and the memory cell, and the output from the read circuit are brought into conduction, and the first switch is off.

In the above structure, the memory cell can include a memory element including a floating gate. Alternatively, the memory cell can include an anti-fuse OTP memory element. In the above structures, binary data can be written to the memory element.

According to the one embodiment of the present invention, a read circuit which can effectively use a judgment result of verification can be provided. That is, according to the one embodiment of the present invention, in the case where it is judged that data is normally written (or erased) in verification, a read circuit which does not generate a malfunction, for example, a failure in normal reading of the written (or erased) data, can be provided. According to the one embodiment of the present invention, even in the case where a power supply potential in verification differs from that in reading, a read circuit which can effectively use a judgment result of verification can be provided. Further, a read circuit which can read data with high accuracy can be provided. In addition, with the above-described read circuit, a highly reliable semiconductor device can be provided.

BRIEF DESCRIPTION OF DRAWINGS

FIGS. 9A and 9B each illustrate an example of a state of data in each operation.

BEST MODE FOR CARRYING OUT THE INVENTION

Figure 1A:
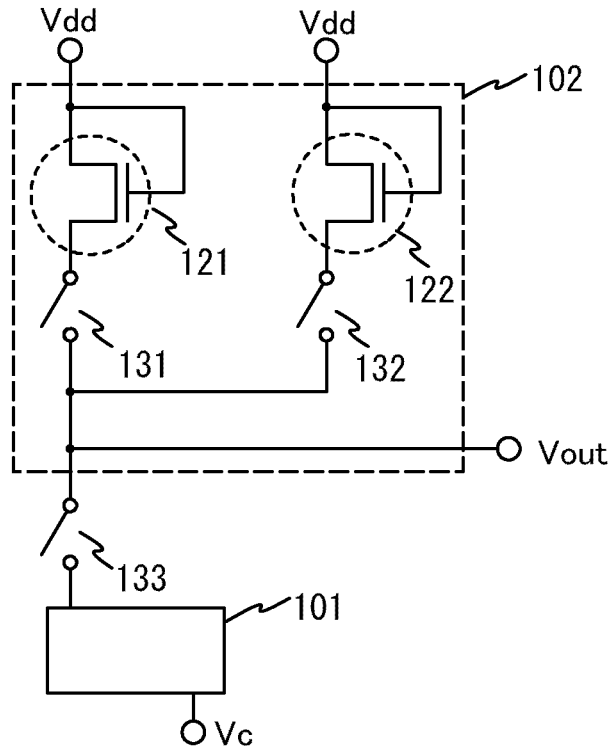
FIG. 1A illustrates an example of a circuit configuration of a semiconductor device and FIG. 1B is a schematic view of characteristics of transistors included in the semiconductor device.

Hereinafter, embodiments of the present invention are described with reference to the drawings. However, the present invention is not limited to the following description. The present invention can be implemented in various different ways and it will be readily appreciated by those skilled in the art that various changes and modifications are possible without departing from the spirit and scope of the present invention. Therefore, the present invention should not be interpreted as being limited to the description of the embodiments to be given below. Note that reference numerals denoting the same portions are commonly used in different drawings.

Note that each structure illustrated in drawings or the like in embodiments is sometimes exaggerated for simplicity. Therefore, embodiments of the present invention are not limited to such scales.

(Embodiment 1)

In this embodiment, an example of a circuit configuration of a semiconductor device which is one embodiment of the disclosed invention, a schematic view of characteristics of transistors included in the semiconductor device, and an example of circuit operation of the semiconductor device will be described with reference to FIGS. 1A and 1B, FIGS. 2A and 2B, FIGS. 3A to 3C, and FIGS. 4A to 4C.

Figure 1B:
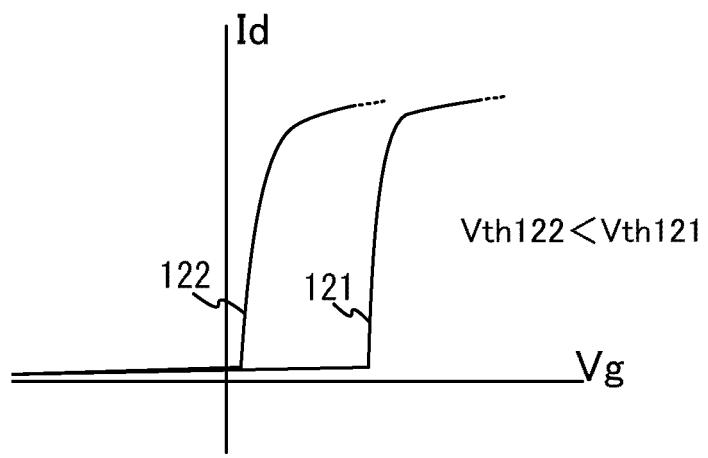
Figure 2A:
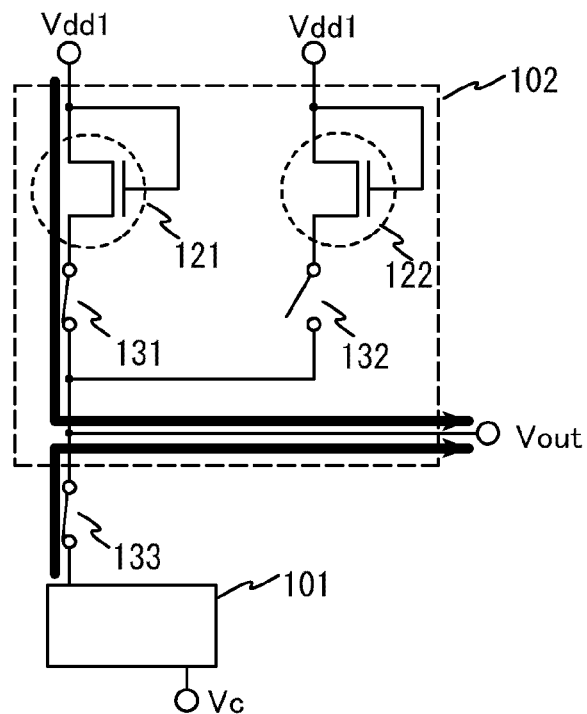
FIGS. 2A and 2B each illustrate an example of circuit operation of a semiconductor device.
Figure 2B:
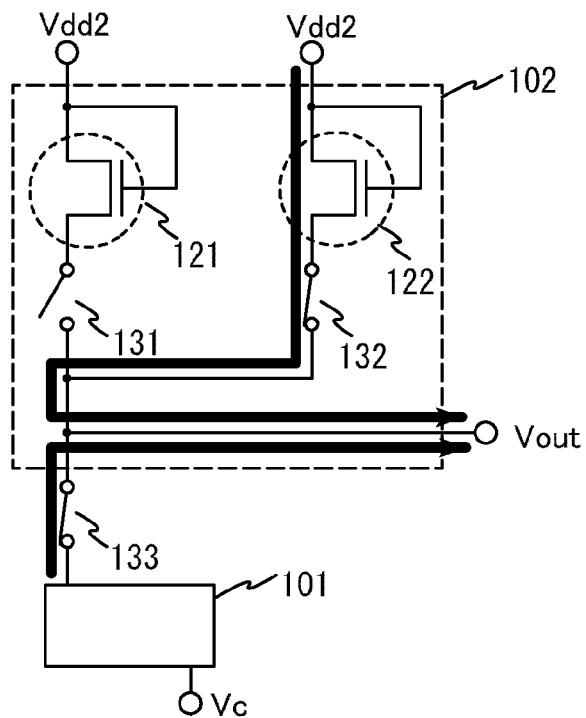
Figure 3A:
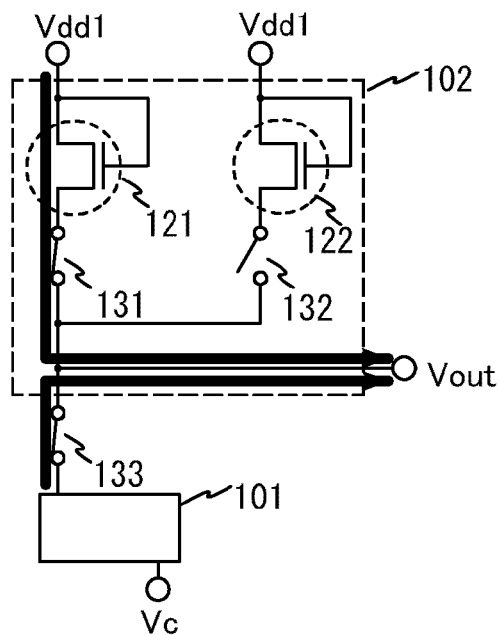
FIGS. 3A and 3B each illustrate an example of circuit operation of a semiconductor device and FIG. 3C is a schematic view of characteristics of transistors included in the semiconductor device.
Figure 3B:
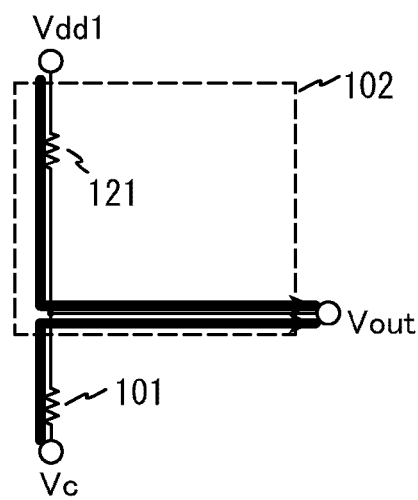
Figure 3C:
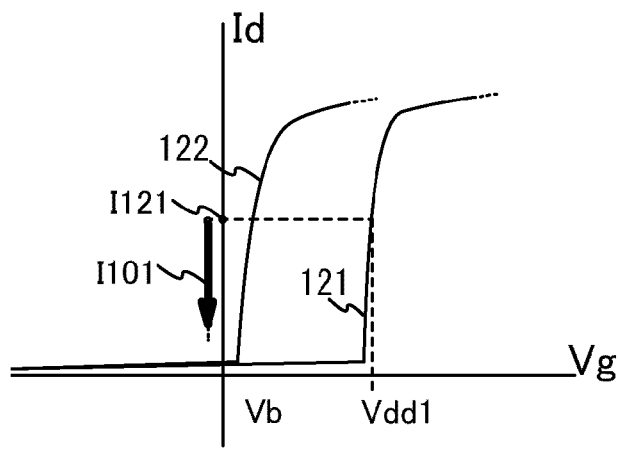
Figure 4A:
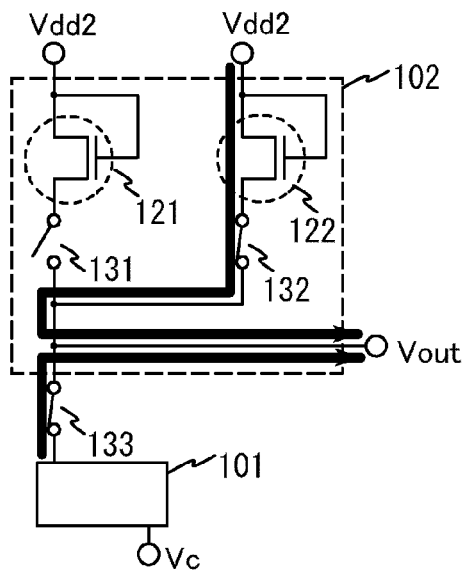
FIGS. 4A and 4B each illustrate an example of circuit operation of a semiconductor device and FIG. 4C is a schematic view of characteristics of transistors included in the semiconductor device.
Figure 4B:
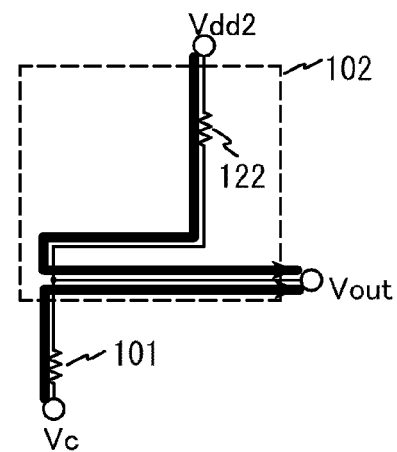
Figure 4C:
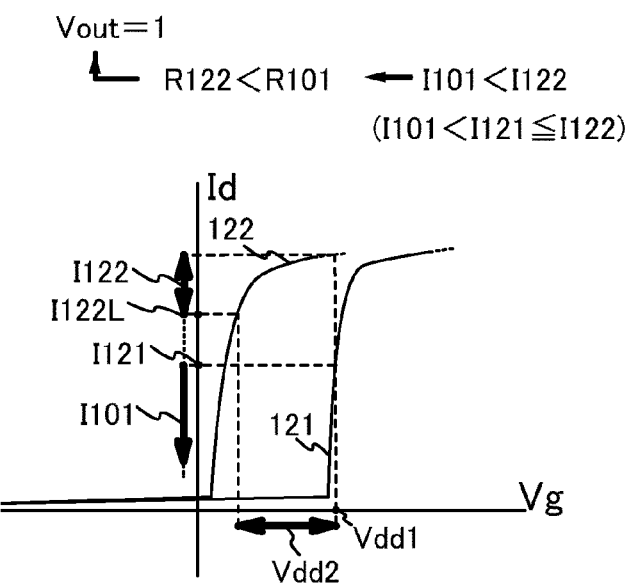

FIG. 1A illustrates an example of a circuit configuration of a semiconductor device, and FIG. 1B is a schematic view of characteristics of transistors included in the semiconductor device. FIGS. 2A and 2B each illustrate an example of circuit operation of a semiconductor device. FIGS. 3A and 3B each illustrates an example of circuit operation of a semiconductor device, and FIG. 3C is a schematic view of characteristics of transistors included in the semiconductor device. FIGS. 4A and 4B each illustrate an example of circuit operation of a semiconductor device, and FIG. 4C is a schematic view of characteristics of transistors included in the semiconductor device.

<Circuit Configuration of Semiconductor Device>

A semiconductor device including a read circuit 102 is illustrated in FIG. 1A. The read circuit 102 includes a first transistor 121, a second transistor 122, a first switch 131, and a second switch 132.

A first terminal of the first transistor 121 is electrically connected to a gate of the first transistor 121, and a second terminal of the first transistor 121 is electrically connected to an output Vout of the read circuit 102 via the first switch 131. A first terminal of the second transistor 122 is electrically connected to a gate of the second transistor 122, and a second terminal of the second transistor 122 is electrically connected to the output Vout of the read circuit 102 via the second switch 132.

In the above structure, the first terminal of the first transistor 121 and the first terminal of the second transistor 122 are electrically connected to a wiring to which a power supply potential Vdd is supplied. Here, a power supply potential supplied to the first terminal of the first transistor 121 may be the same potential as or a different potential from a power supply potential supplied to the first terminal of the second transistor 122.

The read circuit 102 has a function of reading data written to (or erased from) a memory cell 101. The read circuit 102 may include an inverter which is electrically connected to an output from the read circuit or a sense amplifier which is electrically connected to the output from the read circuit.

The semiconductor device can include the memory cell 101. That is, the semiconductor device can be incorporated into the memory cell 101. In that case, the memory cell 101 can be electrically connected to the output Vout of the read circuit 102 via a third switch 133. The memory cell 101 is electrically connected to a wiring to which a common potential Vc is supplied. In this manner, the semiconductor device includes the memory cell 101, whereby an element included in the read circuit 102 and an element included in the memory cell 101 can be formed over the same substrate through the same process.

Alternatively, the semiconductor device can include a terminal which can be electrically connected to the memory cell 101. For example, a storage medium including the memory cell 101 can be inserted in and ejected from the semiconductor device. In this case, in the state in which the storage medium including the memory cell 101 is inserted in the semiconductor device, the memory cell 101 can be electrically connected to the output Vout of the read circuit 102 via the third switch 133.

<Characteristics of Transistors Included in Semiconductor Device>

FIG. 1B is a schematic view of Id-Vg characteristics of the first transistor 121 and the second transistor 122 which are included in the semiconductor device. As shown in FIG. 1B, threshold voltage Vth of the first transistor 121 is different from threshold voltage Vth of the second transistor 122. Specifically, threshold voltage Vth121 of the first transistor 121 is higher than threshold voltage Vth122 of the second transistor 122. Accordingly, the first transistor 121 and the second transistor 122 where a relation of Vth122<Vth121 is satisfied are used.

N-channel transistors can be used as the first transistor 121 and the second transistor 122. It is preferable that both of the first transistor 121 and the second transistor 122 have positive threshold voltage.

For example, a channel formation region of the first transistor 121 can be formed using an oxide semiconductor (that is, an oxide semiconductor is used as a main component), and a channel formation region of the second transistor 122 can be formed using silicon (that is, silicon is used as a main component). The channel formation regions of the first transistor 121 and the second transistor 122 are formed using different semiconductor materials in this manner, whereby the threshold voltage of the first transistor 121 can easily be made to differ from that of the second transistor 122 in comparison with the case where the channel formation regions of the first transistor 121 and the second transistor 122 are formed using the same semiconductor material.

As long as a relation of Vth122<Vth121 is satisfied, it is possible to use materials other than the above-described materials which are used for forming the channel formation regions of the first transistor 121 and the second transistor 122. In that case, different semiconductor materials may be used for forming the channel formation regions of the first transistor 121 and the second transistor 122, or the same semiconductor material may be used for forming the channel formation regions of the first transistor 121 and the second transistor 122. In the case where the same semiconductor material is used, the threshold voltage of the first transistor 121 can be made to differ from that of the second transistor 122 by changing the amount of or a material used for an impurity added to a semiconductor layer, a method for manufacturing the semiconductor layer, a structure of the transistor, or the like.

<Circuit Operation Semiconductor Device>

FIGS. 2A and 2B each illustrate an example of circuit operation of the semiconductor device illustrated in FIG. 1A.

FIG. 2A illustrates an example of circuit operation of the semiconductor device in verification in which whether data is normally written to (or erased from) the memory cell is judged. FIG. 2B illustrates an example of circuit operation of the semiconductor device in general reading. Note that reading of data for judgment is referred to as verification, and general reading of data is simply referred to as reading.

As illustrated in FIG. 2A, in verification, the first switch 131 is turned on, whereby the first transistor 121 and the output Vout of the read circuit 102 are brought into conduction, and the second switch 132 is off. In addition, the third switch 133 is turned on, whereby the memory cell 101 and the output Vout of the read circuit 102 are brought into conduction. In verification, a power supply potential supplied from the outside to the wiring which is electrically connected to the first terminal of the first transistor 121 and the first terminal of the second transistor 122 is Vdd1.

As illustrated in FIG. 2B, in reading, the second switch 132 is turned on, whereby the second transistor 122 and the output Vout of the read circuit 102 are brought into conduction, and the first switch 131 is off. In addition, the third switch 133 is turned on, whereby the memory cell 101 and the output Vout of the read circuit 102 are brought into conduction. In reading, a power supply potential supplied from the outside to the wiring which is electrically connected to the first terminal of the first transistor 121 and the first terminal of the second transistor 122 is Vdd2.

As illustrated in FIGS. 2A and 2B, reading of data in verification can be performed using the first transistor 121, and reading of data in reading can be performed using the second transistor 122.

As shown in FIG. 1B, the threshold voltage Vth121 of the first transistor 121 is higher than the threshold voltage Vth122 of the second transistor 122. Therefore, reading of data in verification can be performed using the first transistor 121 of which the threshold voltage Vth121 is relatively high, whereas reading of data in reading can be performed using the second transistor 122 of which the threshold voltage Vth122 is relatively low.

In FIGS. 2A and 2B, the power supply potential Vdd2 has the same value as or a value smaller than the value of the power supply potential Vdd1. That is, the power supply potential Vdd2 is lower than or equal to the power supply potential Vdd1.

The circuit operation of the semiconductor device illustrated in FIGS. 2A and 2B will be described with reference to FIGS. 3A to 3C and FIGS. 4A to 4C. FIGS. 3A and 3B each illustrate the circuit operation of the semiconductor device in verification illustrated in FIG. 2A. FIGS. 4A and 4B each illustrate the circuit operation of the semiconductor device in reading illustrated in FIG. 2B.

As illustrated in FIG. 3A, in verification, the first switch 131 and the third switch 133 are turned on, whereby the output Vout of the read circuit 102 and each of the first transistor 121 and the memory cell 101 are brought into conduction, and the second switch 132 is off. In verification, a power supply potential supplied from the outside to the first terminal of the first transistor 121 is Vdd1.

FIG. 3B is a simplified view of FIG. 3A. Because the first transistor 121 illustrated in FIG. 3A functions as a resistor in FIG. 3B, the first transistor 121 can be considered as a resistor. In addition, because the memory cell 101 illustrated in FIG. 3A functions as a resistor in FIG. 3B, the memory cell 101 can be considered as a resistor.

As illustrated in FIG. 3B, in verification, the wiring to which the power supply potential Vdd1 is supplied is electrically connected to the output Vout of the read circuit 102 via the first transistor 121, and the wiring to which the common potential Vc is supplied is electrically connected to the output Vout of the read circuit 102 via the memory cell 101. The first transistor 121 and the memory cell 101 can be considered as resistors. Therefore, when a resistance value R121 of the first transistor 121 is larger than a resistance value R101 of the memory cell 101 (R121>R101), the potential of the output Vout of the read circuit 102 is a value close to Vc. In contrast, when the resistance value R121 of the first transistor 121 is smaller than the resistance value R101 of the memory cell 101 (R121<R101), the potential of the output Vout of the read circuit 102 is a value close to Vdd1.

For example, Vout can be referred to as "0" when a relation of R121>R101 is satisfied and Vout can be referred to as "1" when a relation of R121<R101 is satisfied. For example, when Vout is "1" in verification, it can be judged that data is written (or erased) normally.

A relation between current I121 flowing to the first transistor 121 and current I101 flowing to the memory cell 101 when Vout is "1" is described with reference to FIG. 3C. FIG. 3C is a schematic view of Id-Vg characteristics of the first transistor 121 and the second transistor 122. In verification, the first transistor 121 the gate of which is supplied with the power supply potential Vdd1 is used. Therefore, it is found that current flowing between the first terminal and the second terminal of the first transistor 121 in verification is the current I121 illustrated in FIG. 3C. In addition, Vout is "1", that is, a relation of R121<R101 is satisfied; therefore, it is found that the current I101 flowing to the memory cell 101 has a value smaller than that of the current I121.

As described above, it is found that the current I101 flowing to the memory cell 101 to which it is judged that data is written (or erased) normally (Vout=1) in verification has a value smaller than that of the current I121 flowing to the first transistor 121.

Next, the circuit operation of the semiconductor device in general reading is described with reference to FIGS. 4A and 4B.

As illustrated in FIG. 4A, in reading, the second switch 132 and the third switch 133 are turned on, whereby the second transistor 122 and the memory cell 101, and the output Vout of the read circuit 102 are brought into conduction, and the first switch 131 is off. A power supply potential supplied from the outside to the first terminal of the second transistor 122 in reading is Vdd2.

FIG. 4B is a simplified view of FIG. 4A. Because the second transistor 122 illustrated in FIG. 4A functions as a resistor in FIG. 4B, the second transistor 122 can be considered as a resistor. Because the memory cell 101 illustrated in FIG. 4A functions as a resistor in FIG. 4B, the memory cell 101 can be considered as a resistor.

As illustrated in FIG. 4B, in reading, the wiring to which the power supply potential Vdd2 is supplied is electrically connected to the output Vout of the read circuit 102 via the second transistor 122, and the wiring to which the common potential Vc is supplied is electrically connected to the output Vout of the read circuit 102 via the memory cell 101. The second transistor 122 and the memory cell 101 can be considered as resistors. Therefore, when a resistance value R122 of the second transistor 122 is larger than a resistance value R101 of the memory cell 101 (R122>R101), the potential of the output Vout of the read circuit 102 is a value close to Vc. In contrast, when the resistance value R122 of the second transistor 122 is smaller than the resistance value R101 of the memory cell 101 (R122<R101), the potential of the output Vout of the read circuit 102 is a value close to Vdd2.

For example, Vout can be referred to as "0" when a relation of R122>R101 is satisfied and Vout can be referred to as "1" when a relation of R122<R101 is satisfied.

The power supply potential Vdd2 in reading has the same value as or a value smaller than the value of the power supply potential Vdd1 in verification. That is, the power supply potential Vdd2 is lower than or equal to the power supply potential Vdd1. In addition, the power supply potential Vdd2 is higher than or equal to minimum operating voltage VL. The minimum operating voltage VL is a minimum required power supply potential when the semiconductor device is operated.

For example, in the case where the power supply potential Vdd is supplied wirelessly from the outside, the power supply potential Vdd fluctuates in accordance with a distance between the semiconductor device and an external device on the power supply side. For example, when the distance is short, the power supply potential Vdd supplied from the outside increases. In contrast, when the distance is long, the power supply potential Vdd supplied from the outside decreases. In that case, the semiconductor device is designed to operate when a power supply potential which is higher than or equal to the minimum operating voltage VL is supplied.

A distance D2 in reading between the semiconductor device and the external device on the power supply side is generally the same as or longer than a distance D1 in verification between the semiconductor device and the external device on the power supply side. That is, the distance D2 is longer than or equal to the distance D1. Therefore, the power supply potential Vdd2 supplied from the outside in reading is lower than or equal to the power supply potential Vdd1 supplied from the outside in verification.

A relation between current I122 flowing to the second transistor 122 and the current I101 flowing to the memory cell 101 in reading is described with reference to FIG. 4C.

FIG. 4C is a schematic view of Id-Vg characteristics of the first transistor 121 and the second transistor 122. In reading, the second transistor 122 is used and the power supply potential Vdd2 is supplied to the gate of the second transistor 122. The power supply potential Vdd2 in reading has a value within the range from the minimum operating voltage VL to the power supply potential Vdd1 in verification. It is found that current flowing between the first terminal and the second terminal of the second transistor 122 at this time lies within the range of the current I122 shown by an arrow in FIG. 4C.

It is acceptable as long as the lower limit I122L of current flowing to the second transistor 122 in reading is higher than or equal to the current I121 flowing to the first transistor 121 in verification, that is, a relation of I121≦I122L is satisfied. Therefore, the range of the voltage being capable of reading can be set to satisfy a relation of I121≦I122L.

As illustrated in FIG. 4C, the current I122 flowing to the second transistor 122 in reading is higher than the current I121 flowing to the first transistor 121 in verification, and the current I121 flowing to the first transistor 121 in verification is higher than the current I101 flowing to the memory cell 101. That is, the current I122 flowing to the second transistor 122 in reading data is higher than the current I101 flowing to the memory cell 101. As a result, a relation of R122<R101 is satisfied, and Vout in reading is automatically "1".

As described above, this embodiment can provide a read circuit whose Vout is "1" in reading when it is judged that Vout of a memory cell is "1" and data is normally written to (or erased from) the memory cell in verification.

Note that in FIGS. 3A to 3C and FIGS. 4A to 4C, Vout is "0" when relations of R121>R101 and R122>R101 are satisfied, and Vout is "1" when relations of R121<R101 and R122<R101 are satisfied; however, an embodiment is not limited thereto. In contrast, Vout may be "1" when relations of R121>R101 and R122>R101 are satisfied, and Vout may be "0" when relations of R121<R101 and R122<R101 are satisfied.

Further, in FIGS. 3A to 3C, when Vout is "1" in verification, it is judged that data is written (or erased) normally; however, an embodiment is not limited thereto. When Vout is "0" in verification, it may be judged that data is written (or erased) normally.

In addition, the read circuit can include an inverter which is electrically connected to the output from the read circuit or a sense amplifier which is electrically connected to the output from the read circuit. Thus, reading accuracy can be improved.

According to this embodiment, a read circuit which can effectively use a judgment result of verification can be provided. That is, the read circuit does not cause a malfunction, for example, a failure in normal reading of the written (or erased) data, which is an error, is caused in the case where it judged that data is normally written (or erased) in verification. This embodiment can provide a read circuit, which can effectively use a judgment result of verification even in the case where the power supply potential Vdd in verification is different from that in reading. In addition, this embodiment can provide a read circuit which can read data with high accuracy. Further, with the above-described read circuit, this embodiment can provide a highly reliable semiconductor device.

This embodiment can be implemented in combination with another embodiment, as appropriate.

(Embodiment 2)

An example of a circuit configuration of a memory cell included in a semiconductor device which is one embodiment of the disclosed invention will be described with reference to FIGS. 5A to 5C.

Figure 5A:
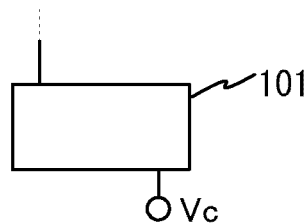
FIGS. 5A to 5C each illustrate an example of a circuit configuration of a memory cell included in a semiconductor device.
Figure 5B:
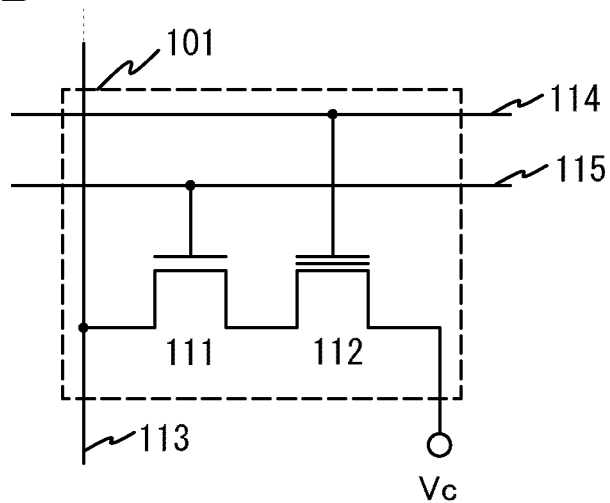
Figure 5C:
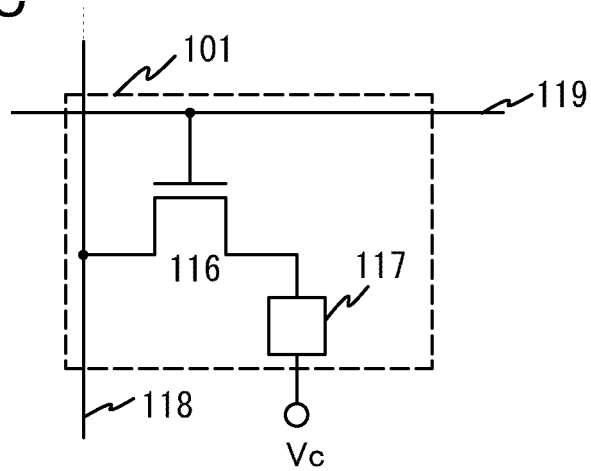

FIGS. 5A to 5C each illustrate a circuit configuration of part of the semiconductor device illustrated in FIG. 1A. The memory cell 101 included in the semiconductor device is illustrated in FIG. 5A. The memory cell 101 is electrically connected to a wiring to which a common potential Vc is supplied. The wiring to which the common potential Vc is supplied is supplied with a ground potential, for example.

FIG. 5B illustrates an example of a circuit configuration of the memory cell 101 in which a memory element 112 including a floating gate is provided. The memory cell 101 illustrated in FIG. 5B includes a selection transistor 111, the memory element 112 having a floating gate, a bit line 113, a word line 114, and a selection line 115. A gate of the selection transistor 111 is electrically connected to the selection line 115, and a first terminal of the selection transistor 111 is electrically connected to the bit line 113, and a second terminal of the selection transistor 111 is electrically connected to a first terminal of the memory element 112. A gate of the memory element 112 having a floating gate is electrically connected to the word line 114, and a second terminal of the memory element 112 is electrically connected to the wiring to which the common potential Vc is supplied. Therefore, the first terminal of the memory element 112 is electrically connected to the bit line 113 via the selection transistor 111. The wiring to which the common potential Vc is supplied is supplied with a ground potential, for example.

Circuit operation of the memory cell 101 in which the memory element 112 including a floating gate is provided is illustrated in FIG. 5B.

The writing of data to the memory cell 101 is performed in such a way that charge (e.g., electrons) is injected into the floating gate of the memory element 112. By injection of charge into the floating gate, threshold voltage of the memory element 112 can be shifted to the positive side. Accordingly, a resistance value of the memory cell 101 can be increased. For example, Vout can be read as 1 (or 0) after writing of data.

After writing of data in the memory cell 101 is terminated, it is judged (verified) whether data is normally written to the memory cell 101 by using the read circuit 102 illustrated in FIG. 1A. As a result, when it is judged that data is normally written, even in the case where the power supply potential Vdd in verification is different from that in reading, it is possible to read the written data normally.

Data is erased by releasing charge (e.g., electrons) stored in the floating gate of the memory element 112. The charge stored in the floating gate is released, whereby the threshold voltage of the memory element 112 can be shifted to the negative side and the resistance value of the memory cell 101 can be reduced. Accordingly, the resistance value of the memory cell 101 can be returned to a value close to an initial state. For example, Vout can be read as 0 (or 1) after erasing (initialization) of data.

After erasing of data from the memory cell 101 is terminated, it is judged (verified) whether data is normally erased from the memory cell 101 by using the read circuit 102 illustrated in FIG. 1A. When it is judged that data is normally erased as the result, even when the power supply potential Vdd in verification is different from that in reading, the erased data can be normally read.

In addition, in the memory cell 101 in which the memory element 112 having a floating gate illustrated in FIG. 5B is provided, the power supply potential Vdd or the power supply potential Vdd boosted by a circuit in the semiconductor device may be used for writing or erasing data. In this case, data is not sufficiently written and erased because of fluctuation of the power supply potential Vdd in some cases. In this case, the resistance value of the memory cell 101 is sometimes intermediate between a value which can be normally taken after writing of data and a value which can be normally taken after erasing of data. In the case where the resistance value of the memory cell 101 is an intermediate value, a judgment result of verification cannot be used effectively in some cases.

However, a semiconductor device including the read circuit 102 illustrated in FIG. 1A is used, whereby the judgment result of verification can be used effectively. As a result, accuracy in reading data can be improved.

FIG. 5C illustrates an example of a circuit configuration in which the memory cell 101 includes a one-time-programmable (OTP) memory element 117. The OTP memory element 117 is a memory element in which data can be written only once.

The memory cell 101 illustrated in FIG. 5C includes a selection transistor 116, the OTP memory element 117, a bit line 118, and a word line 119. A gate of the selection transistor 116 is electrically connected to the word line 119, a first terminal of the selection transistor 116 is electrically connected to the bit line 118, and a second terminal of the selection transistor 116 is electrically connected to a first terminal of the OTP memory element 117. A second terminal of the OTP memory element 117 is electrically connected to a wiring to which the common potential Vc is supplied. Therefore, the first terminal of the OTP memory element 117 is electrically connected to the bit line 118 via the selection transistor 116. The wiring to which the common potential Vc is supplied is supplied with a ground potential, for example.

For example, an anti-fuse OTP memory element can be used as the OTP memory element 117. As the anti-fuse OTP memory element, for example, a silicide memory or an organic memory can be used. The silicide memory includes a structure in which amorphous silicon is provided between a pair of electrodes. The organic memory includes a structure in which an organic film is provided between a pair of electrodes. The anti-fuse OTP memory element has high resistance until writing operation is performed.

Circuit operation of the memory cell 101 including the OTP memory element 117 illustrated in FIG. 5C will be described.

Data is written to the memory cell 101 in such a way that a high potential is supplied to the first terminal of the OTP memory element 117, and high voltage is applied to the OTP memory element 117. When high voltage is applied to the OTP memory element 117, the OTP memory element 117 can be changed (e.g., silicide is formed or fluidization is performed) by generated Joule heat. For example, as for a silicide memory, high voltage is applied between the pair of electrodes, whereby silicide can be formed in amorphous silicon provided between the pair of electrodes. In this manner, the resistance value of the OTP memory element can be decreased. For example, Vout can be read as 1 (or 0) after writing of data.

After writing of data to the memory cell 101 is terminated, it is judged (verified) whether data is normally written to the memory cell 101 by using the read circuit 102 illustrated in FIG. 1A. As a result, when it is judged that data is normally written, the written data can be read normally even in the case where the power supply potential Vdd in verification is different from that in reading.

In addition, in the memory cell 101 in which the OTP memory element 117 illustrated in FIG. 5C is provided, the power supply potential Vdd or the power supply potential Vdd boosted by a circuit in the semiconductor device may be used for writing data. In this case, data is not sufficiently written because of fluctuation of the power supply potential Vdd in some cases. In this case, the resistance value of the memory cell 101 is sometimes intermediate between a value before writing of data and a value which is normally taken after writing of data. In the case where the resistance value of the memory cell 101 is an intermediate value, a judgment result of verification cannot be used effectively in some cases.

However, a semiconductor device including the read circuit 102 illustrated in FIG. 1A is used, whereby the judgment result of verification can be used effectively. As a result, accuracy in reading data can be improved.

Both the memory element 112 including a floating gate illustrated in FIG. 5B and the OTP memory element 117 illustrated in FIG. 5C are memory elements to which binary data can be written.

As described above, a semiconductor device including the read circuit 102 illustrated in FIG. 1A is used, whereby the judgment result of verification can be used effectively. That is, when the semiconductor device including the read circuit 102 illustrated in FIG. 1A is used, in the case where it is judged that data is normally written (or erased) in verification, it is possible to prevent generation of a malfunction, for example, a failure in normal reading of the written (or erased) data, which is an error. When the semiconductor device including the read circuit 102 illustrated in FIG. 1A is used, even in the case where the power supply potential Vdd fluctuates, the judgment result of verification can be used effectively. In addition, data can be read with high accuracy, and a highly reliable semiconductor device can be provided.

This embodiment can be implemented in combination with another embodiment, as appropriate.

(Embodiment 3)

Figure 6:
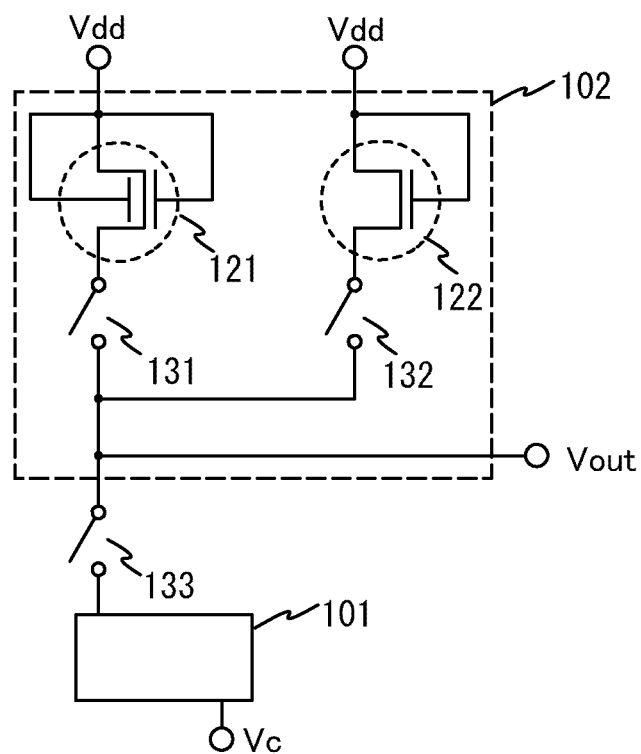
FIG. 6 illustrates an example of a circuit configuration of a semiconductor device.

In this embodiment, an example of a circuit configuration of a semiconductor device which is one embodiment of the disclosed invention will be described with reference to FIG. 6. FIG. 6 is an example in which a structure of the first transistor 121 is different from that in FIG. 1A. A circuit configuration except the structure is similar to the circuit configuration in FIG. 1A.

In FIG. 6, the first transistor 121 has a back gate. In this case, the back gate of the first transistor 121 can be electrically connected to the first terminal of the first transistor 121. Accordingly, the threshold voltage of the first transistor 121 can be shifted to the positive side relatively with ease. As a result, the first transistor 121 and the second transistor 122 which have characteristics shown in FIG. 1B, can be obtained relatively easily.

The circuit operation of the semiconductor device illustrated in FIG. 6 is similar to the circuit operation of the semiconductor device illustrated in FIG. 1A.

The structure illustrated in FIG. 6 is used, whereby a read circuit which can effectively use the judgment result of verification can be provided. That is, in the case where it is judged that data is normally written (or erased) in verification, it is possible to provide a read circuit which does not cause a malfunction, for example, a failure in normal reading of the written (or erased) data, which is an error. This embodiment can provide a read circuit which can effectively use the judgment result of verification even in the case where the power supply potential Vdd in verification is different from that in reading. In addition, this embodiment can provide a read circuit in which data can be read with high accuracy. Further, with the above-described read circuit, this embodiment can provide a highly reliable semiconductor device.

This embodiment can be implemented in combination with another embodiment, as appropriate.

(Embodiment 4)

In this embodiment, an example of a transistor included in a semiconductor device which is one embodiment of the disclosed invention will be described with reference to FIGS. 7A to 7C. A transistor in FIGS. 7A to 7C includes a channel formation region formed using an oxide semiconductor.

Figure 7A:
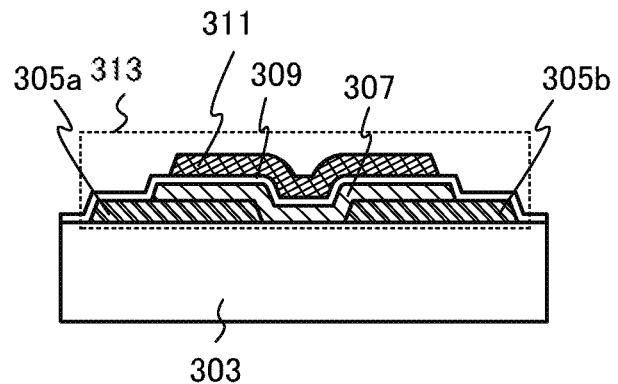
FIGS. 7A to 7C each illustrate an example of a structure of a transistor included in a semiconductor device.

A transistor 313 illustrated in FIG. 7A is formed using a pair of a conductive layer 305a and a conductive layer 305b which function as a source electrode and a drain electrode and which are provided over a layer or substrate 303 having an insulating surface, a semiconductor layer 307 provided over the conductive layer 305a and the conductive layer 305b, a gate insulating layer 309 provided over the semiconductor layer 307, and a gate electrode 311 provided over the gate insulating layer 309.

The transistor 313 illustrated in FIG. 7A has a top-gate structure in which the gate electrode 311 is provided above the semiconductor layer 307. In addition, the transistor 313 has a bottom-contact structure in which the conductive layer 305a and the conductive layer 305b which function as a source electrode and a drain electrode are each provided below the semiconductor layer 307. Note that the transistor 313 can have a top-contact structure in which the conductive layer 305a and the conductive layer 305b are provided over the semiconductor layer 307.

The semiconductor layer 307 can be formed with the use of an In—Sn—Ga—Zn—O-based oxide semiconductor; an In—Ga—Zn—O-based oxide semiconductor, an In—Sn—

Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; an In—O-based oxide semiconductor, a Sn—O-based oxide semiconductor, or a Zn—O-based oxide semiconductor. Here, for example, an In—Ga—Zn—O-based oxide semiconductor means an oxide film containing indium (In), gallium (Ga), and zinc (Zn), and there is no limitation on the composition ratio thereof. The In—Ga—Zn—O-based oxide semiconductor may contain an element other than In, Ga, and Zn. Further, $SiO_2$ may be contained in the above oxide semiconductor.

For the semiconductor layer 307, an oxide semiconductor represented by the chemical formula, $InMO_3(ZnO)_m$ (m>0) can be used. Here, M represents one or more metal elements selected from Zn, Ga, Al, Mn, and Co. For example, M can be Ga, Ga and Al, Ga and Mn, Ga and Co, or the like.

The semiconductor layer 307 is preferably formed by a sputtering method. For example, the semiconductor layer 307 can be formed by a sputtering method using a target of the aforementioned oxide.

An oxide semiconductor used for the semiconductor layer 307 is an i-type (intrinsic) oxide semiconductor or an oxide semiconductor extremely close to an i-type oxide semiconductor, that is, a substantially i-type (intrinsic) oxide semiconductor. The i-type (intrinsic) oxide semiconductor or substantially i-type (intrinsic) oxide semiconductor is obtained in such a manner that hydrogen, which is an n-type impurity, is removed from an oxide semiconductor, and the oxide semiconductor is highly purified so as to contain as few impurities that are not main components of the oxide semiconductor as possible.

The layer or substrate 303 having an insulating surface has a structure in which an insulating layer is provided over a substrate, for example. There is no limitation on a substrate as long as it can withstand a later manufacturing process. For example, a structure in which an insulating layer is provided over an insulating substrate such as a glass substrate, a semiconductor substrate such as a silicon substrate, a conductive substrate such as a metal substrate, a flexible substrate such as a plastic substrate, or the like can be used as a substrate. In this case, the insulating layer serves as a base preventing diffusion of impurities from the substrate. For example, an insulating layer serving as a base is formed to have a single-layer structure including an insulating layer or a stacked structure including two or more insulating layers, and each insulating layer includes any of silicon oxide, silicon oxynitride, silicon nitride, hafnium oxide, aluminum oxide, tantalum oxide, or the like. Note that it is preferable that the insulating layer contain hydrogen and water as little as possible.

The conductive layer 305a and the conductive layer 305b are formed using a metal material selected from titanium, aluminum, tungsten, chromium, copper, tantalum, and molybdenum; an alloy material containing the metal material as a component, or the like. Alternatively, the conductive layer 305a and the conductive layer 305b can be formed using a material selected from manganese, magnesium, zirconium, and beryllium. Further alternatively, a material including aluminum and one or more elements selected from titanium, tantalum, tungsten, molybdenum, chromium, neodymium, and scandium can be used. Note that the conductive layer 305a and the conductive layer 305b can be formed to have a single-layer structure or a stacked structure including two or more layers.

The gate insulating layer 309 is formed to have a single-layer structure using an insulating layer or a stacked structure including two or more insulating layers, and each insulating layer includes any of silicon oxide, silicon nitride, silicon oxynitride, aluminum oxide, aluminum nitride, aluminum oxynitride, hafnium oxide, or the like. The gate insulating layer 309 is preferably formed so as to include as little hydrogen or water as possible.

The gate electrode 311 can be formed to have a single-layer structure or a stacked structure including two or more layers formed using a metal material selected from molybdenum, titanium, chromium, tantalum, tungsten, aluminum, copper, neodymium, scandium, and the like; an alloy material containing the metal material as a main component; or a nitride (metal nitride) of the metal material. The gate electrode 311 is formed so as to overlap with the semiconductor layer 307 with the gate insulating layer 309 provided therebetween.

Figure 7B:
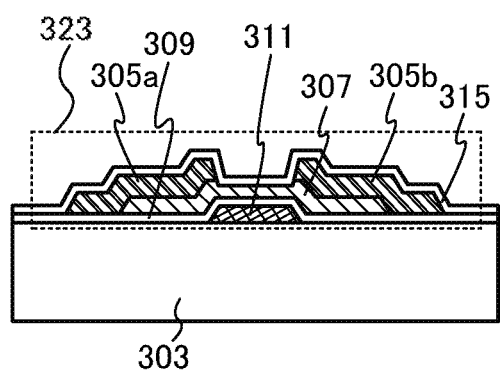

A transistor 323 illustrated in FIG. 7B is formed using the gate electrode 311 provided over the layer or substrate 303 having an insulating surface, the gate insulating layer 309 provided to cover the gate electrode 311, the semiconductor layer 307 provided over the gate insulating layer 309, and a pair of the conductive layer 305a and the conductive layer 305b which are provided over the semiconductor layer 307. In addition, a passivation layer 315 is provided to cover the transistor 323.

The passivation layer 315 can be formed to have a single-layer structure or a stacked structure including two or more layers formed using a material such as silicon oxide, silicon oxynitride, silicon nitride, hafnium oxide, aluminum oxide, or tantalum oxide. Note that whether an insulating layer such as a passivation layer is formed over the transistor 323, the number of insulating layers to be stacked, the thickness of an insulating layer, or the like can be changed as appropriate in accordance with the application of the transistor. Layers other than the passivation layer 315 can be formed using a material or the like which is similar to that of the transistor 313.

The transistor 323 has a bottom-gate structure in which the semiconductor layer 307 is provided over the gate electrode 311. In addition, the transistor 323 has a top-contact structure in which the conductive layer 305a and the conductive layer 305b which function as a source electrode and a drain electrode are provided over the semiconductor layer 307. In addition, the transistor 323 has a channel-etched structure in which the semiconductor layer 307 which overlaps with neither the conductive layer 305a nor the conductive layer 305b is partly removed because of etching. Note that the transistor 323 can have a bottom-contact structure in which the conductive layer 305a and the conductive layer 305b are provided below the semiconductor layer 307.

Figure 7C:
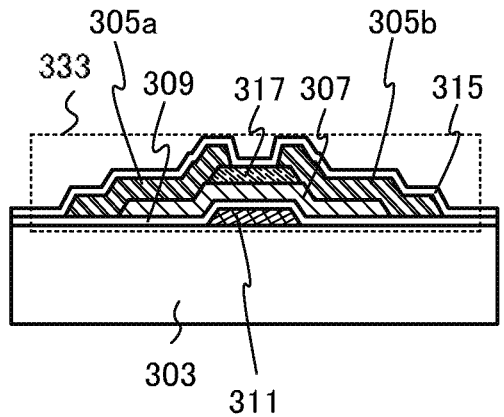
Figure 8A:
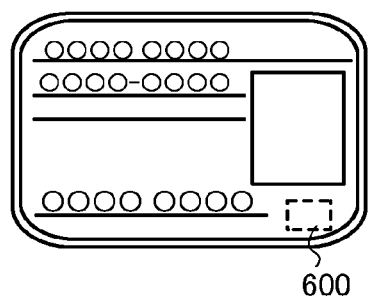
FIGS. 8A to 8F illustrate usage examples of a semiconductor device.
Figure 8B:
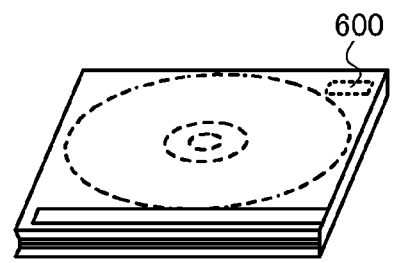
Figure 8C:
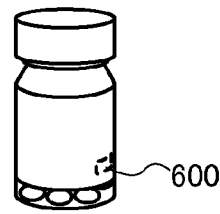
Figure 8D:
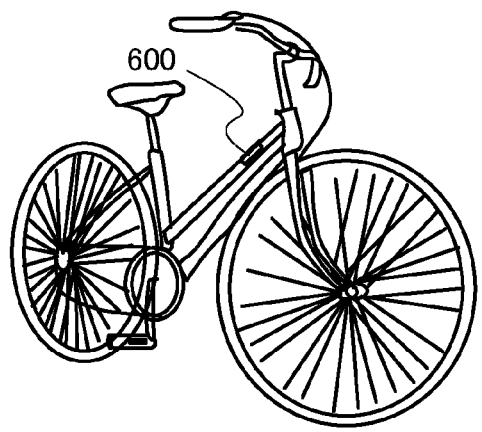
Figure 8E:
Figure 8F:
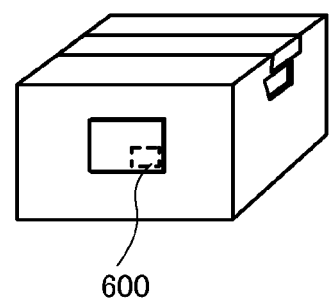

A transistor 333 illustrated in FIG. 7C, which is different from that of the transistor 323 illustrated in FIG. 7B, has a structure in which a channel protective layer 317 is provided over the semiconductor layer 307. The transistor 333 is formed using the gate electrode 311 provided over the layer or substrate 303 having an insulating surface, the gate insulating layer 309 which is provided to cover the gate electrode 311, the semiconductor layer 307 provided over the gate insulating layer 309, the channel protective layer 317 which overlaps with the gate electrode 311 and which is provided over the semiconductor layer 307, and a pair of the conductive layer 305a and the conductive layer 305b which are provided over the semiconductor layer 307. In addition, the passivation layer 315 is provided to cover the transistor 333.

By providing the channel protective layer 317 in the transistor 333, damage to a region serving as a channel formation region of the semiconductor layer 307 (e.g., a reduction in thickness due to plasma damage or an etchant in an etching step) can be prevented in the later manufacturing process. Materials and the like of layers except the channel protective layer 317 can be similar to those of the transistor 313.

As the first transistor 121 or the second transistor 122 included in the semiconductor device illustrated in FIG. 1A, any of the transistor 313, the transistor 323, and the transistor 333 illustrated in FIGS. 7A to 7C, each of which has the semiconductor layer 307 including an oxide semiconductor as a channel formation region, can be used.

For example, a transistor in which a channel formation region is formed using an oxide semiconductor (that is, an oxide semiconductor is used as a main component) illustrated in FIGS. 7A to 7C can be used as the first transistor 121 illustrated in FIG. 1A, and a transistor in which a channel formation region is formed using silicon (that is, silicon is used as a main component) can be used as the second transistor 122 illustrated in FIG. 1A. The channel formation regions of the first transistor 121 and the second transistor 122 are formed using different semiconductor materials in this manner, whereby the threshold voltage of the first transistor 121 can easily be made to differ from that of the second transistor 122 in comparison with the case where the first transistor 121 and the second transistor 122 are formed using the same semiconductor material. As a result, the first transistor 121 and the second transistor 122 which have characteristics shown in FIG. 1B, can be obtained relatively easily.

Note that N-channel transistors can be used as the first transistor 121 and the second transistor 122. It is preferable that both of the first transistor 121 and the second transistor 122 have positive threshold voltage.

In addition, a back gate may be further provided for the transistor 313, the transistor 323, or the transistor 333 illustrated in FIGS. 7A to 7C, each of which has the semiconductor layer 307 including an oxide semiconductor as the channel formation region. As the first transistor 121 or the second transistor 122 included in the semiconductor device illustrated in FIG. 1A, a transistor having a back gate and a channel formation region formed using an oxide semiconductor can be used.

For example, a transistor having a back gate and a channel formation region formed using an oxide semiconductor (that is, an oxide semiconductor is used as a main component) can be used as the first transistor 121 illustrated in FIG. 1A, and a transistor having a channel formation region formed using silicon (that is, silicon is used as a main component) can be used as the second transistor 122 illustrated in FIG. 1A. A circuit configuration in this case corresponds to FIG. 6. A transistor having a back gate and a channel formation region formed using an oxide semiconductor is used as the first transistor 121, whereby the threshold voltage of the first transistor 121 can be shifted to the positive side. As a result, the first transistor 121 and the second transistor 122 which have characteristics shown in FIG. 1B, can be obtained relatively easily.

Note that a highly purified oxide semiconductor includes extremely few carriers, and the carrier concentration thereof is lower than $1\times10^{12}/cm^3$, preferably lower than $1\times10^{11}/cm^3$. Here, a semiconductor with a carrier concentration lower than $1\times10^{11}/cm^3$ is called an intrinsic (i-type) semiconductor, and a semiconductor with a carrier concentration higher than or equal to $1\times10^{11}/cm^3$ and lower than $1\times10^{12}/cm^3$ is called a substantially intrinsic (substantially i-type) semiconductor.

Because the number of carriers in the oxide semiconductor is very small, the off-state current of the transistor can be drastically reduced.

For example, the above-described transistor can be used as the first switch 131, the second switch 132, and the third switch 133 which are included in the semiconductor device illustrated in FIG. 1A in addition to the first transistor 121 or the second transistor 122. In addition, the above-described transistor can be used as the selection transistor 111 included in the memory cell 101 illustrated in FIG. 5B or the selection transistor 116 included in the memory cell 101 illustrated in FIG. 5C. Thus, accuracy in reading data from the memory cell can be improved.

According to this embodiment, the first transistor 121 and the second transistor 122 which have characteristics shown in FIG. 1B can be obtained relatively easily. The first transistor 121 and the second transistor 122 which have characteristics shown in FIG. 1B are used, whereby a read circuit which can effectively use the judgment result of verification as described in Embodiment 1 can be provided. That is, in the case where it is judged that data is normally written (or erased) in verification, it is possible to provide a read circuit which does not cause a malfunction, for example, a failure in normal reading of the written (or erased) data, which is an error. In addition, the transistor described in this embodiment is used, whereby it is possible to provide a read circuit which can effectively use the judgment result of verification even in the case where the power supply potential Vdd in verification is different from that in reading. In addition, it is possible to provide a read circuit in which data can be read with high accuracy. Further, with the above-described read circuit, a highly reliable semiconductor device can be provided.

This embodiment can be implemented in combination with another embodiment, as appropriate.

(Embodiment 5)

In this embodiment, a usage example of a semiconductor device which is one embodiment of the disclosed invention will be described with reference to FIGS. 8A to 8F.

A semiconductor device in FIG. 1A including the read circuit 102 which reads data written to the memory cell 101 is particularly effective for a semiconductor device in which the power supply potential Vdd is supplied from the outside wirelessly (in a noncontact manner). The semiconductor device in which the power supply potential Vdd is supplied from the outside wirelessly (in a noncontact manner) includes an antenna for receiving a power supply potential. Further, the semiconductor device can include an antenna for transmitting and receiving data.

An application example of a semiconductor device (a semiconductor device 600) as shown in FIG. 1A including the read circuit 102 which reads data written to the memory cell 101 will be described with reference to FIGS. 8A to 8F. The semiconductor device 600 finds widespread applications. The semiconductor device 600 which is one embodiment of the disclosed invention can be used by being provided for, for example, bills, coins, securities, bearer bonds, certificates (e.g., driver's licenses or resident's cards, see FIG. 8A), storage media (e.g., DVD software or video tapes, see FIG. 8B), packaging containers (e.g., wrapping paper or bottles, see FIG. 8C), vehicles (e.g., bicycles, see FIG. 8D), personal belongings (e.g., bags or glasses, see FIG. 8E), foods, plants, animals, human bodies, clothes, commodities, objects such as electronic devices (e.g., liquid crystal display devices, EL display devices, television sets, or mobile phones), or tags on objects (see FIG. 8F), or the like.

The semiconductor device 600 can be fixed to an object by being mounted on the object, attached to a surface of the object, or embedded in the object. For example, if an object is a book, the semiconductor device 600 can be fixed by being embedded in paper of the book. In addition, if the semiconductor device 600 is included in a package formed using an organic resin and fixed into an object, the semiconductor device 600 can be fixed into the object by being embedded in the organic resin.

Since the semiconductor device 600 achieves reduction in size, an attractive design of the object itself is not spoiled even after the semiconductor device 600 is fixed to the object. In addition, when the semiconductor device 600 is provided for bills, coins, securities, bearer bonds, certificates, or the like, an authentication function can be provided, and the semiconductor device 600 can be useful for preventing forgery of bills or the like can be obtained. Further, when the semiconductor device 600 is attached to packaging containers, storage media, personal belongings, foods, clothes, commodities, electronic devices, or the like, a system such as an inspection system can be efficiently used. Furthermore, when the semiconductor device 600 is attached to the vehicles, the vehicles can have higher security against theft or the like.

As described above, the semiconductor device (the semiconductor device 600) as shown in FIG. 1A including the read circuit 102 which reads data written to the memory cell 101 finds widespread applications.

According to this embodiment, data can be read with high accuracy; therefore, reliability in authentication characteristics of an object, security of an object, and the like can be improved.

This embodiment can be implemented in combination with another embodiment, as appropriate.

This application is based on Japanese Patent Application serial no. 2010-090569 filed with the Japan Patent Office on Apr. 9, 2010, the entire contents of which are hereby incorporated by reference.

Explanation of Reference

101: memory cell, 102: read circuit, 111: selection transistor, 112: memory element, 113: bit line, 114: word line, 115: selection line, 116: selection transistor, 117: OTP memory element, 118: bit line, 119: word line, 121: first transistor, 122: second transistor, 131: first switch, 132: second switch, 133: third switch, 303: substrate, 307: semiconductor layer, 309: gate insulating layer, 311: gate electrode, 313: transistor, 315: passivation layer, 317: channel protective layer, 323: transistor, 333: transistor, 600: semiconductor device, 305*a*: conductive layer, and 305*b*: conductive layer.

The invention claimed is:

1. A semiconductor device comprising a read circuit, the read circuit comprising:
a first transistor;
a second transistor;
a first switch; and
a second switch,
wherein a first terminal of the first transistor is electrically connected to a gate of the first transistor,
wherein a second terminal of the first transistor is electrically connected to an output of the read circuit via the first switch,
wherein a first terminal of the second transistor is electrically connected to a gate of the second transistor,
wherein a second terminal of the second transistor is electrically connected to the output of the read circuit via the second switch,
wherein the first terminal of the first transistor is configured to be supplied with a first power supply potential and the first terminal of the second transistor is configured to be supplied with a second power supply potential,
wherein a channel formation region of the first transistor comprises an oxide semiconductor, and
wherein a channel formation region of the second transistor comprises silicon.

2. The semiconductor device according to claim 1, wherein the read circuit is configured to read data in a memory cell.

3. The semiconductor device according to claim 1, wherein the first power supply potential and the second power supply potential in reading are lower than or equal to the first power supply potential and the second power supply potential in verification, respectively.

4. The semiconductor device according to claim 1, wherein the first power supply potential and the second power supply potential are supplied from an outside wirelessly.

5. The semiconductor device according to claim 1, wherein the read circuit comprises an inverter electrically connected to the output of the read circuit or a sense amplifier electrically connected to the output of the read circuit.

6. The semiconductor device according to claim 1, wherein the first transistor comprises a back gate.

7. The semiconductor device according to claim 1 further comprising:
a memory cell; and
a third switch,
wherein the memory cell is electrically connected to the output of the read circuit via the third switch.

8. The semiconductor device according to claim 7,
wherein in verification, the first switch and the third switch are turned on, and the first transistor and the output of the read circuit, and the memory cell and the output of the read circuit are brought into conduction, and
wherein in reading, the second switch and the third switch are turned on, and the second transistor and the output of the read circuit, and the memory cell and the output of the read circuit are brought into conduction.

9. The semiconductor device according to claim 7, wherein the memory cell comprises a memory element including a floating gate.

10. The semiconductor device according to claim 7, wherein the memory cell comprises an anti-fuse one-time-programmable memory element.

11. The semiconductor device according to claim 1, wherein the first power supply potential is a same potential as the second power supply potential.

12. A semiconductor device comprising a read circuit, the read circuit comprising:
a first transistor;
a second transistor;
a first switch; and
a second switch,
wherein a first terminal of the first transistor is electrically connected to a gate of the first transistor,
wherein a second terminal of the first transistor is electrically connected to an output of the read circuit via the first switch,
wherein a first terminal of the second transistor is electrically connected to a gate of the second transistor,
wherein a second terminal of the second transistor is electrically connected to the output of the read circuit via the second switch,
wherein the first terminal of the first transistor is configured to be supplied with a first power supply potential and the first terminal of the second transistor is configured to be supplied with a second power supply potential, and wherein threshold voltage of the first transistor is different from threshold voltage of the second transistor.

13. The semiconductor device according to claim 12, wherein the read circuit is configured to read data in a memory cell.

14. The semiconductor device according to claim 12, wherein the first power supply potential and the second power supply potential in reading are lower than or equal to the first power supply potential and the second power supply potential in verification, respectively.

15. The semiconductor device according to claim 12, wherein the first power supply potential and the second power supply potential are supplied from an outside wirelessly.

16. The semiconductor device according to claim 12, wherein the read circuit comprises an inverter electrically connected to the output of the read circuit or a sense amplifier electrically connected to the output of the read circuit.

17. The semiconductor device according to claim 12, wherein the first transistor comprises a back gate.

18. The semiconductor device according to claim 12 further comprising:
   a memory cell; and
   a third switch,
   wherein the memory cell is electrically connected to the output of the read circuit via the third switch.

19. The semiconductor device according to claim 18,
   wherein in verification, the first switch and the third switch are turned on, and the first transistor and the output of the read circuit, and the memory cell and the output of the read circuit are brought into conduction, and
   wherein in reading, the second switch and the third switch are turned on, and the second transistor and the output of the read circuit, and the memory cell and the output of the read circuit are brought into conduction.

20. The semiconductor device according to claim 18, wherein the memory cell comprises a memory element including a floating gate.

21. The semiconductor device according to claim 18, wherein the memory cell comprises an anti-fuse one-time-programmable memory element.

22. The semiconductor device according to claim 12, wherein the first power supply potential is a same potential as the second power supply potential.

23. A semiconductor device comprising a read circuit, the read circuit comprising:
   a first transistor;
   a second transistor;
   a first switch; and
   a second switch,
   wherein a first terminal of the first transistor is electrically connected to a gate of the first transistor,
   wherein a second terminal of the first transistor is electrically connected to an output from the read circuit via the first switch,
   wherein a first terminal of the second transistor is electrically connected to a gate of the second transistor,
   wherein a second terminal of the second transistor is electrically connected to the output from the read circuit via the second switch,
   wherein the first terminal of the first transistor is configured to be supplied with a first power supply potential and the first terminal of the second transistor is configured to be supplied with a second power supply potential,
   wherein in verification, the first switch is turned on, and the first transistor and the output of the read circuit are brought into conduction,
   wherein in reading, the second switch is turned on, and the second transistor and the output of the read circuit are brought into conduction, and
   wherein threshold voltage of the first transistor is higher than threshold voltage of the second transistor.

24. The semiconductor device according to claim 23, wherein the read circuit is configured to read data in a memory cell.

25. The semiconductor device according to claim 23, wherein the first power supply potential and the second power supply potential in reading are lower than or equal to the first power supply potential and the second power supply potential in verification, respectively.

26. The semiconductor device according to claim 23, wherein the first power supply potential and the second power supply potential are supplied from an outside wirelessly.

27. The semiconductor device according to claim 23, wherein the read circuit comprises an inverter electrically connected to the output of the read circuit or a sense amplifier electrically connected to the output of the read circuit.

28. The semiconductor device according to claim 23, wherein the first transistor comprises a back gate.

29. The semiconductor device according to claim 23, further comprising:
   a memory cell; and
   a third switch,
   wherein the memory cell is electrically connected to the output of the read circuit via the third switch.

30. The semiconductor device according to claim 29,
   wherein in the verification, the first switch and the third switch are turned on, and the first transistor and the output of the read circuit, and the memory cell and the output of the read circuit are brought into conduction, and
   wherein in the reading, the second switch and the third switch are turned on, and the second transistor and the output of the read circuit, and the memory cell and the output of the read circuit are brought into conduction.

31. The semiconductor device according to claim 29, wherein the memory cell comprises a memory element including a floating gate.

32. The semiconductor device according to claim 29, wherein the memory cell comprises an anti-fuse one-time-programmable memory element.

33. The semiconductor device according to claim 23, wherein the first power supply potential is a same potential as the second power supply potential.

* * * * *